(12) United States Patent
Li et al.

(10) Patent No.: US 9,040,140 B2
(45) Date of Patent: May 26, 2015

(54) SMT TAPE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Yong Li, Shenzhen (CN); Wen-Hsiung Chen, New Taipei (TW); Shin-Wen Chen, New Taipei (TW); Shu-Sheng Peng, Shenzhen (CN); Wen-Chang Chen, New Taipei (TW); Yu-Tsan Cheng, New Taipei (TW); Ling-Qi Yi, Shenzhen (CN); Li-Min Liu, Shenzhen (CN); Fu-Li Long, Shenzhen (CN); Fu-Chun Li, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 227 days.

(21) Appl. No.: 13/726,546

(22) Filed: Dec. 25, 2012

(65) Prior Publication Data
US 2014/0113097 A1 Apr. 24, 2014

(30) Foreign Application Priority Data

Oct. 18, 2012 (CN) .......................... 2012 1 03969766

(51) Int. Cl.
H05K 13/00 (2006.01)

(52) U.S. Cl.
CPC .................................. *H05K 13/0084* (2013.01)

(58) Field of Classification Search
CPC .................................. B32B 7/06; B32B 7/12
USPC ................... 428/67, 40.1, 34.1, 137, 179, 76; 206/714
See application file for complete search history.

(56) References Cited

U.S. PATENT DOCUMENTS

2011/0233109 A1* 9/2011 Ziganto ......................... 206/714

* cited by examiner

*Primary Examiner* — Alexander Thomas
(74) *Attorney, Agent, or Firm* — Novak Druce Connolly Bove + Quigg LLP

(57) ABSTRACT

A SMT tape includes a carrier tape, a number of separation pads, a number of workpieces, and a package tape. The carrier tape includes a package surface and defines a number of receiving grooves in the package surface and arranged along a length direction of the carrier tape. The separation pads are received in the receiving grooves and fixed to bottom surfaces of the receiving grooves respectively. Each separation pad includes a separation surface opposite to a bottom surface of the corresponding receiving groove and a number of protrusions protruding up from the separation surface. The workpieces are respectively received in the receiving grooves. Each workpiece includes a main body and an adhesive layer positioned between the corresponding separation pad and the main body. The package tape is adhered to the package surface and seals the receiving grooves.

10 Claims, 2 Drawing Sheets

SMT TAPE

BACKGROUND

1. Technical Field

The present disclosure relates to surface mount technology (SMT) and, particularly, to a SMT tape.

2. Description of Related Art

Camera modules include a flexible printed circuit board (FPCB) and a lens module positioned on the FPCB. To reinforce mechanical strength of the FPCB and provide electromagnetic interference (EMI) shielding, the camera module also includes a stiffener adhered to and electrically connected to the FPCB opposite to the lens module using conductive adhesive. To increase efficiency, the stiffeners with the conductive adhesive can be packaged into a SMT tape and mounted to respective FPCBs using SMT. However, the stiffeners are readily stuck to the SMT tape by the conductive adhesive and are not easily separated away from the SMT tape.

Therefore, it is desirable to provide a SMT tape, which can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Embodiments of the present disclosure will now be described in detail with reference to the drawings.

Figure 1:
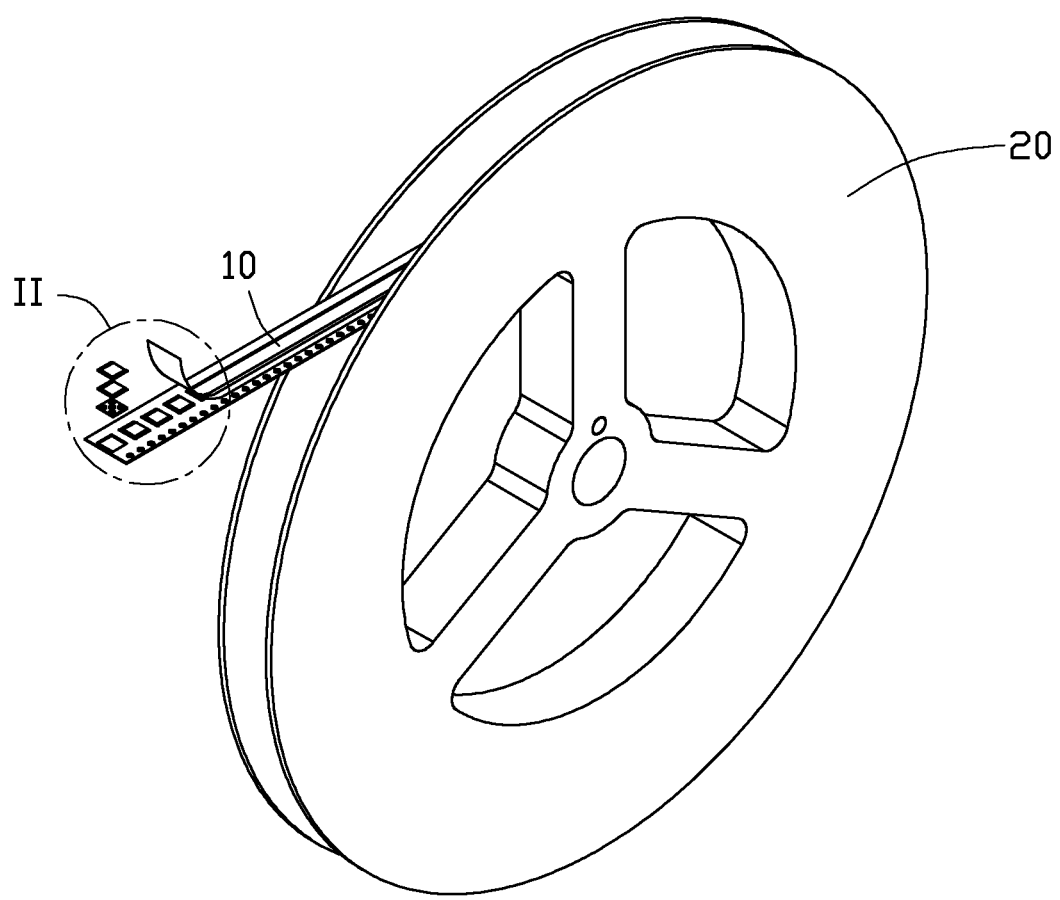
FIG. 1 is an isometric schematic view of a SMT tape, according to an embodiment.
Figure 2:
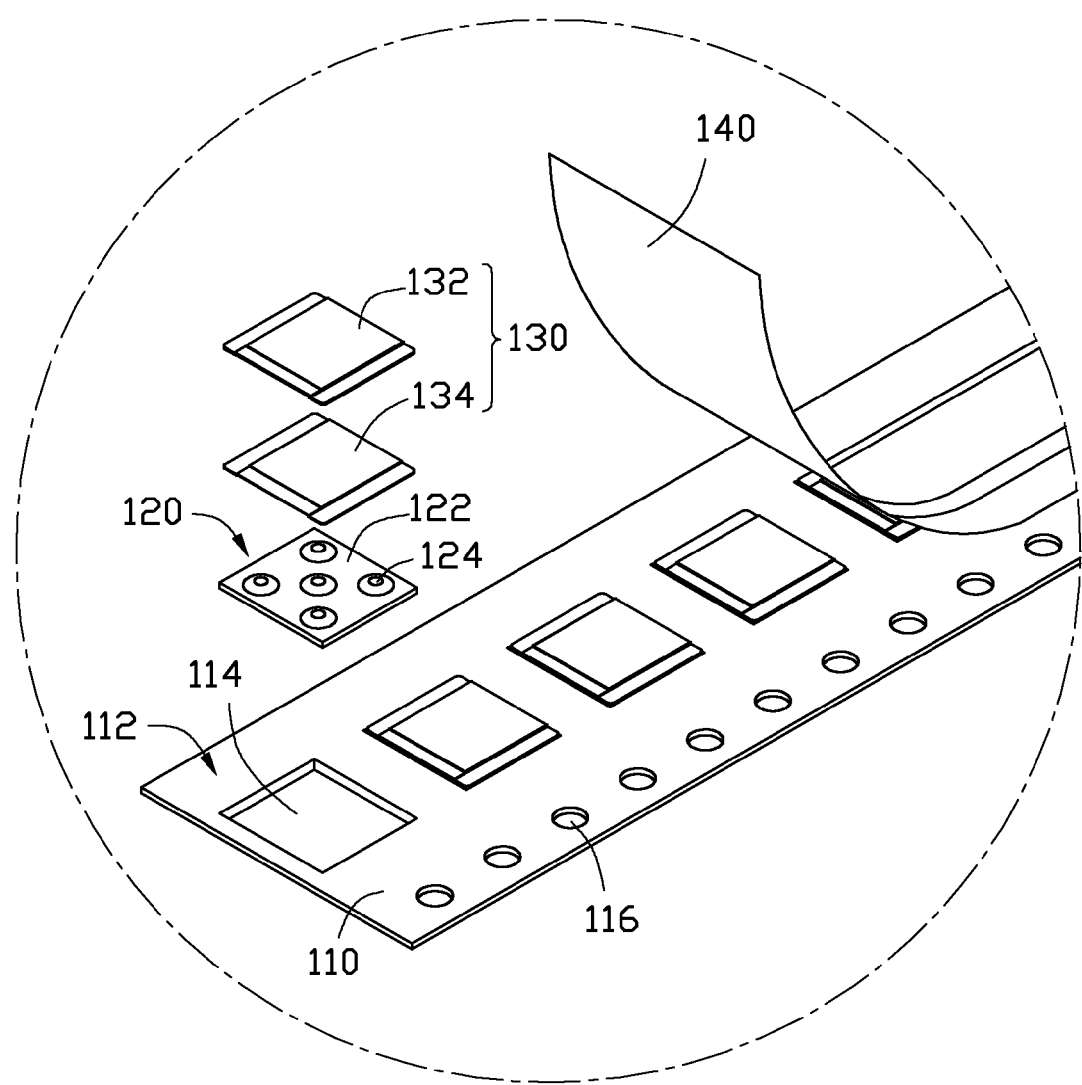
FIG. 2 is an enlarged view of a portion II of FIG. 1.

FIGS. 1-2 show a SMT tape 10 according to an embodiment. The SMT tape 10 includes a carrier tape 110, a number of separation pads 120, a number of workpieces 130, and a package tape 140. The carrier tape 110 includes a package surface 112 and defines a number of receiving grooves 114 in the package surface 112. The receiving grooves 114 are arranged along a length direction of the carrier tape 110 and are elongated indentations. The separation pads 120 are received in the receiving grooves 114 and respectively fixed to bottom surfaces of the receiving grooves 114. Each separation pad 120 includes a separation surface 122 opposite to the corresponding bottom surface and a number of protrusions 124 protruding upward from the corresponding separation surface 122. The workpieces 130 are respectively received in the receiving grooves 114. Each workpiece 130 includes a main body 132 and an adhesive layer 134 positioned between the separation pad 120 and the main body 132. The package tape 140 is adhered to the package surface 112 and seals the receiving grooves 114.

As such, each adhesive layer 134 only contacts with the protrusions 124 of the corresponding separation pad 120. That is, contact area between each separation pad 120 and the corresponding adhesive layer 134 is reduced and thus bonding force between the separation pad 120 and the corresponding adhesive layer 134 is correspondingly reduced. As such, the corresponding workpiece 130 can be readily separated from the carrier tape 110.

The carrier tape 110 is made of plastic. Each receiving groove 114 is rectangular. The carrier tape 112 also defines a number of through holes 116 in the package surface 112. The through holes 116 are arranged along a lengthwise side of the carrier tape 110. As such, the SMT tape 10, which is wound on a SMT reel 20, can be rewound by rotating a rear of a rewinding mechanism which has a number of teeth engaging with the through holes 116. The rewinding mechanism also can tear the package tape 140 away from the package surface 112 to expose the workpieces 130. As such, the workpieces 130 are protected by the package tape 140 within the respective receiving grooves 114 before use and become accessible after removing of the package tape 140.

The separation pads 120 are made of polyethylene terephthalate (PET) and fixed to the corresponding bottom surface by an interference fit between each separation pad 120 and the corresponding receiving groove 114 or by adhesive.

The protrusions 124 in each separation pad 120 can be arranged in an array. As such, uniformity of the bonding force between the separation pad 120 and the corresponding adhesive layer 134 can be improved.

The main body 132 can be a stiffener for reinforcing a FPCB of a camera module. The adhesive layer 134 can be a conductive adhesive layer.

The package tape 140 can be a thermal package tape.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. A SMT tape, comprising:
    a carrier tape comprising a package surface and defining a plurality of receiving grooves in the package surface, the receiving grooves arranged along a length direction of the carrier tape;
    a plurality of separation pads received in the receiving grooves and fixed to bottom surfaces of the receiving grooves, respectively, each separation pad comprising a separation surface opposite to a bottom surface of the corresponding receiving groove and a plurality of protrusions protruding from the separation surface;
    a plurality of workpieces received in the receiving grooves, respectively, each workpiece comprising a main body and an adhesive layer positioned between the corresponding separation pad and the main body; and
    a package tape adhered to the package surface and sealing the receiving grooves.

2. The SMT tape of claim 1, wherein the carrier tape is made of plastic.

3. The SMT tape of claim 1, wherein each receiving groove is rectangular.

4. The SMT tape of claim 1, wherein the carrier tape defines a plurality of through holes in the package surface and arranged along a lengthwise side of the carrier tape.

5. The SMT tape of claim 1, wherein the separation pads are made of polyethylene terephthalate.

6. The SMT tape of claim 1, wherein each separation pad is fixed to the corresponding bottom surface by an interference fit between each separation pad and the corresponding receiving groove or by adhesive.

7. The SMT tape of claim 1, wherein the protrusions in each separation pad are arranged in an array.

8. The SMT tape of claim 1, wherein the main body is a stiffener.

9. The SMT tape of claim 1, wherein the adhesive layer is a conductive adhesive layer.

10. The SMT tape of claim 1, wherein the package tape is a thermal package tape.

\* \* \* \* \*